(12) United States Patent
Kim

(10) Patent No.: US 9,379,701 B2
(45) Date of Patent: Jun. 28, 2016

(54) SEMICONDUCTOR DEVICE HAVING THROUGH CHIP VIA

(71) Applicant: SK hynix Inc., Gyeonggi-do (KR)

(72) Inventor: Hong-Gyeom Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/661,890

(22) Filed: Mar. 18, 2015

(65) Prior Publication Data
US 2016/0105171 A1    Apr. 14, 2016

(30) Foreign Application Priority Data

Oct. 14, 2014 (KR) .......................... 10-2014-0138234

(51) Int. Cl.
*H03K 19/00* (2006.01)
*H03K 17/687* (2006.01)
*H01L 23/48* (2006.01)

(52) U.S. Cl.
CPC ............ *H03K 17/687* (2013.01); *H01L 23/481* (2013.01)

(58) Field of Classification Search
USPC ........................... 327/108; 326/82–83, 88, 92
See application file for complete search history.

(56) References Cited

U.S. PATENT DOCUMENTS

| | | | |
|---|---|---|---|
| 7,940,074 B2 * | 5/2011 | Ku ...................... | H04L 25/0272 326/21 |
| 8,836,395 B2 * | 9/2014 | Lin ................ | H03K 19/018585 327/170 |
| 2013/0214761 A1 | 8/2013 | Chang et al. | |
| 2014/0306734 A1 * | 10/2014 | Lee ................ | H03K 19/017509 326/82 |

* cited by examiner

*Primary Examiner* — An Luu
(74) *Attorney, Agent, or Firm* — IP & T Group LLP

(57) ABSTRACT

A semiconductor device includes a plurality of chips; a first through-chip via vertically passing through the chips, a power-saving unit suitable for being precharged to a precharge voltage during a precharge period; and a driving unit suitable for driving data using the precharge voltage outputted from the power-saving unit, during a driving period.

17 Claims, 4 Drawing Sheets

SEMICONDUCTOR DEVICE HAVING THROUGH CHIP VIA

CROSS-REFERENCE TO RELATED APPLICATIONS

The present application claims priority of Korean Patent Application No. 10-2014-0138234, filed on Oct. 14, 2014, which is incorporated herein by reference in its entirety.

BACKGROUND

1. Field

Various embodiments of the present invention relate to a semiconductor device, and, more particularly, to a semiconductor device including a through chip via.

2. Description of the Related Art

In general, technology for packaging semiconductor integrated circuits has developed to satisfy the demands of miniaturization, mounting reliability, and high performance. Recently, various technologies for stacked packages have been developed in an attempt to satisfy these demands. An example of a stacked package can be seen, in 3-dimensional (3D) semiconductor devices having multiple chips that are stacked in a single package, allowing an increase in the integration degree thereof. In this example, the stacked chips are electrically coupled through through-chip vias, for example, through-silicon vias (TSVs).

A TSV is formed through the semiconductor chips. The TSV may be formed as follows. First, a through-hole may be bored in the semiconductor chip, and a silicon-based insulating layer (e.g., a silicon oxide layer) may be formed on the inner circumference of the through-hole. Then, the through-hole may be filled with a conductive material to form a TSV capable of transmitting an electrical signal.

However, when data is transmitted through the TSV during a write or read operation of the semiconductor chip, current consumption may increase due to high capacitance in the TSV at low-voltages and/or high-speed states, during signaling of data. Thus, when multiple TSVs are driven, power consumption may momentarily increase.

SUMMARY

Various embodiments are directed to a semiconductor device including a through-chip via for precharging that reduces power consumption when a plurality of through-chip vias are driven.

In an embodiment, a semiconductor device may include: a plurality of chips; a first through-chip via vertically passing through the chips; a power-saving unit suitable for being precharged to a precharge voltage during a precharge period; and a driving unit suitable for driving data using the precharge voltage outputted from the power-saving unit, during a driving period.

The semiconductor device may further include a precharging unit suitable for inverting a voltage level of the first through-chip via during the precharge period, and shifting the voltage level to the precharge voltage.

The driving unit may include: a control signal generation section suitable for generating a control signal based on the data during the driving period; and a driving section suitable for controlling the voltage level of the first through-chip via through charge-sharing with the precharged voltage level of the power saving unit in response to the control signal.

The control signal generation section may include: a first control signal generator suitable for generating a control signal having a low level when the data is at a high level during the driving period; and a second control signal generator suitable for generating a control signal having a high level when the data is at a low level during the driving period.

The precharging unit may include: a level shifter suitable for shifting the voltage level of the first through-chip via to the precharge voltage; and an inverter suitable for inverting a signal outputted from the level shifter and transmitting the inverted signal to the power-saving unit.

The power-saving unit may include a second through-chip via vertically passing through the chip or a capacitor.

In an embodiment, a semiconductor device may include: a plurality of chips; a first through-chip via vertically passing through the chips; a power-saving unit suitable for being precharged to a precharge voltage level based on a voltage level of the first through-chip via; and a driving unit suitable for driving data using the precharged voltage of the power-saving unit based on a driving enable signal.

The semiconductor device may further include a precharging unit coupled between the first through-chip via and the power-saving unit, and suitable for inverting the voltage level of the first through-chip via at a period in which the driving enable signal is deactivated, and shifting the voltage level to the precharge voltage.

The driving unit may include: a control signal generation section suitable for generating a control signal based on the driving enable signal and the data; and a driving section coupled between the first through-chip via and the power-saving unit, and suitable for controlling the voltage level of the first through-chip via through charge-sharing with the precharged voltage level of the power-saving unit in response to the control signal.

The control signal generation section may include: a first control signal generator suitable for generating a control signal having a low level when the data is at a high level and the driving enable signal is activated; and a second control signal generator suitable for generating a control signal having a high level when the data is at a low level and the driving enable signal is activated.

The precharging unit may include: a level shifter suitable for shifting the voltage level of the first through-chip via to the precharge voltage; and an inverter suitable for inverting a signal outputted from the level shifter and transmitting the inverted signal to the power-saving unit.

The power-saving unit may include a second through-chip via vertically passing through the chips or a capacitor.

The driving section may include: a pull-up transistor suitable for pull-up driving the first through-chip via to a power supply voltage level when the control signal outputted from the first control signal generator has a low-level; and a pull-down transistor suitable for pull-down driving the first through-chip via to a ground voltage level when the control signal outputted from the second control signal generator has a high-level.

In an embodiment, there is provided an operating method of a semiconductor device including first and second through-chip vias vertically passing through a plurality of chips. The operating method may include: precharging the second through-chip via based on a voltage level of the first through-chip via during a precharge period; allowing charge-sharing between the first through-chip via and the second through-chip via based on data to drive the first through-chip via, during a driving period.

The precharging of the voltage level of the second through-chip via may include: shifting the voltage level of the first through-chip via to a precharge voltage level; and inverting the shifted voltage level.

DETAILED DESCRIPTION

Figure 1:
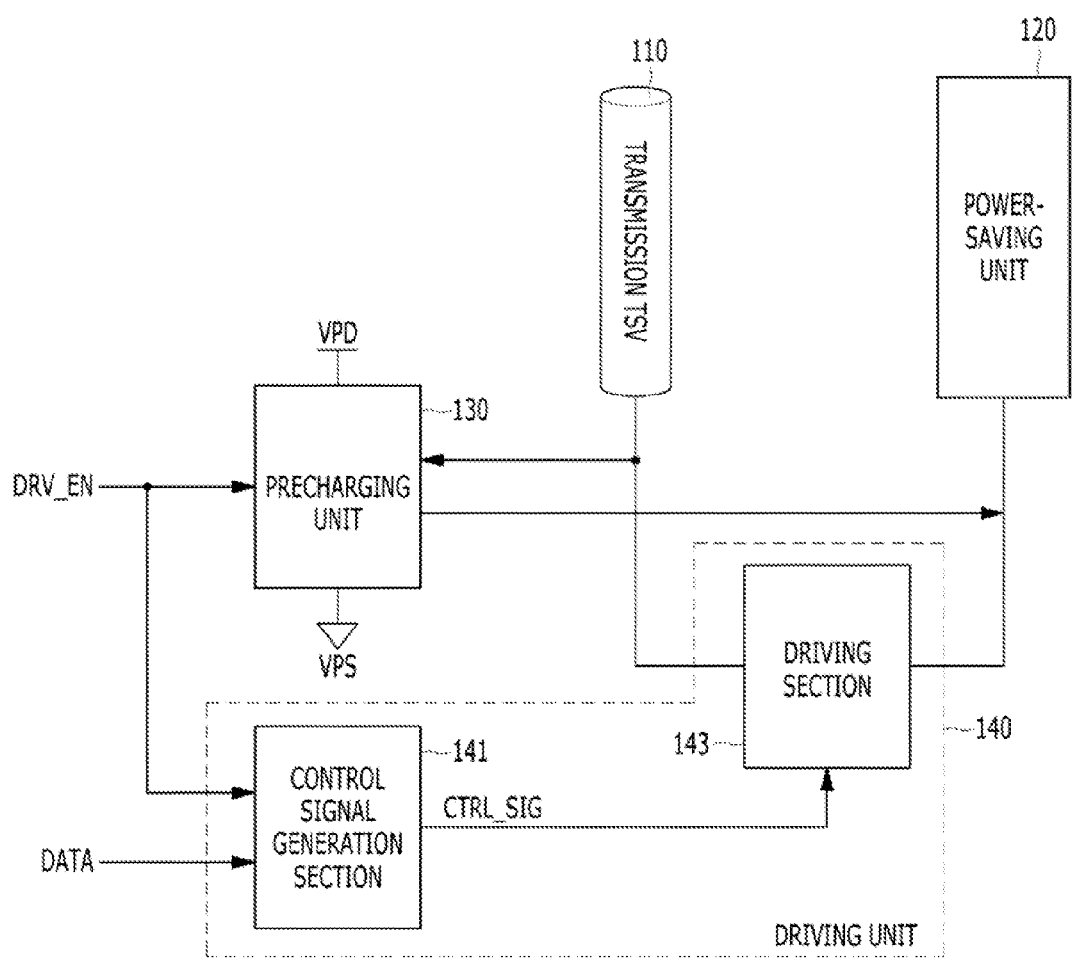
FIG. 1 is a block diagram illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art, Throughout the disclosure, like reference numerals refer to like parts in the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but also where a third layer exists between the first layer and the second layer or the substrate.

Hereinafter, a through-silicon via (TSV) will be exemplary described for a through-chip via.

FIG. 1 is a block diagram illustrating a semiconductor device in accordance with an embodiment of the present invention.

Referring to FIG. 1 the semiconductor device may include a transmission TSV 110, a power-saving unit 120, a precharging unit 130, and a driving unit 140. The driving unit 140 may include a control signal generation section 141 and a driving section 143.

The transmission TSV 110 may include a TSV for being driven being driven by data DATA (i.e., the transmission TSV 110 may transmit the data DATA). Although not illustrated, the semiconductor device may include a plurality of chips (e.g., memory chips) stacked therein, and input/output the data DATA through the transmission TSV 110, which vertically passes through the chips.

The power-saving unit 120 may be precharged to a precharge voltage VPD/VPS during a precharge period before a driving operation for the transmission TSV 110. The power-saving unit 120 may include a capacitor or a dummy TSV, which vertically passes through the chips.

The precharging unit 130 may precharge the power-saving unit 120. The precharging unit 130 may receive a driving enable signal DRV_EN, a voltage level of the transmission TSV 110, and precharge the power-saving unit 120. In other words, the precharging unit 130 may invert a voltage level of the transmission TSV 110, and convert the voltage level into the first precharge voltage VPD having a higher voltage level than a power supply voltage or the second precharge voltage VPS having a lower voltage level than a ground voltage, according to a voltage level of the transmission TSV 110 (corresponding to data DATA).

The driving unit 140 may drive the transmission TSV 110 according to the data DATA.

The control signal generation section 141 may receive the driving enable signal DRV_EN and the data DATA. The driving enable signal DRV_EN may be activated when a write or read operation is to be performed in response to a command. The data DATA may include data applied from outside when the command is a write command, or data outputted from the stacked chips when the command is a read command.

The control signal generation section 141 may generate a control signal CTRL_SIG based on the driving enable signal DRV_EN and the data DATA. The control signal CTRL_SIG may be activated when the driving enable signal DRV_EN is activated.

The driving section 143 may connect the transmission TSV 110 and the power-saving unit 120 in response to the control signal CTRL_SIG so that the transmission TSV 110 may be driven to a voltage level corresponding to the data DATA through a charge sharing operation between the transmission TSV 110 and the power-saving unit 120.

Now, the operation of the semiconductor device will be described as follows. Before the driving enable signal DRV_EN is activated, the power-saving unit 120 may be precharged with the first precharge voltage VPD or the second precharge voltage VPS by the precharging unit 130.

Then, when a write or read command is applied to the semiconductor device, the driving enable signal DRV_EN may be activated. The precharging unit 130 may block the precharge operation for the power-saving unit 120 as the driving enable signal DRV_EN is activated. The driving unit 140 may be driven when the driving enable signal DRV_EN is activated. The control signal generation section 141 may generate the control signal CTRL_SIG in response to the driving enable signal DRV_EN and the data DATA. The driving section 143 receiving the control signal CTRL_SIG may control a driving operation using charge sharing between the transmission TSV 110 and the power-saving unit 120. That is, the transmission TSV 110 may drive the data DATA by sharing the charges of the power-saving unit 120, which is precharged before the data DATA is driven.

Thus, the semiconductor device may include the power-saving unit 120, precharge the power-saving unit 120 before the driving operation for the transmission TSV 110, and drive the data DATA by sharing the charge stored in the power-saving unit 120 during the driving operation for the transmission TSV 110. Thus, the semiconductor device may reduce power consumption that may momentarily increase during a driving operation in a multi-chip package having a plurality of TSVs.

Figure 2:
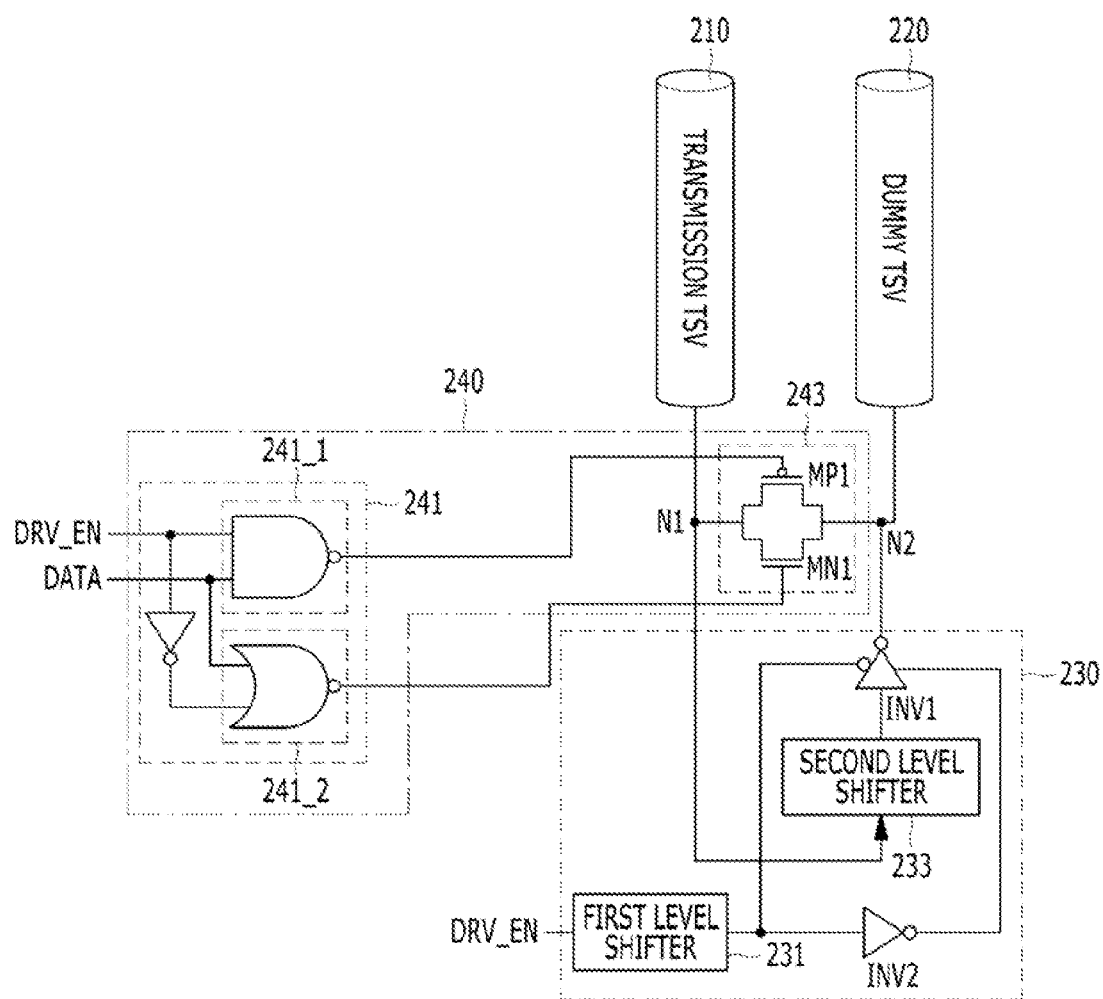
FIG. 2 is a circuit diagram illustrating a power-saving semiconductor device in accordance with an embodiment of the present invention.

FIG. 2 is a circuit diagram illustrating a semiconductor device in accordance with an embodiment of the present invention.

Referring to FIG. 2, the semiconductor device may include a transmission TSV 210, a dummy TSV (or a power-saving TSV) 220, a precharging unit 230, and a driving unit 240.

The transmission TSV 210 may include a TSV for being driven by data DATA Le., the transmission TSV 210 may transmit the data DATA).

The dummy TSV 220 may be precharged to a precharge voltage VPD/VPS during a precharge period before a driving operation for the transmission TSV 210. The number of dummy TSVs may be set to correspond to the number of transmission TSVs.

The precharging unit 230 may include a first level shifter 231, a second level shifter 233, and a first inverter INV1. The driving unit 240 may include a control signal generation section 241 and a driving section 243.

The first level shifter 231 may receive a driving enable signal DRV_EN, and shift a voltage level of the driving enable signal DRV_EN to a voltage level corresponding to the precharge voltage VPD/VPS.

The second level shifter 233 may shift a voltage level of a first node N1 coupled to the transmission TSV 210 and the driving section 243 to a voltage level corresponding to the precharge voltage VPD/VPS.

The first inverter INV1 may drive a second node N2 coupled to the second level shifter 233, the TSV 220, and the driving section 243. The first inverter INV1 may invert a voltage level outputted from the second level shifter 233, and drive the second node N2 with the inverted voltage level.

The output signal of the first level shifter 231 may be used as a signal for controlling the first inverter INV1. A second inverter INV2 may be used to invert he output signal of the first level shifter 231.

The control signal generation section 241 may include a first control signal generator 241_1 and a second control signal generator 241_2.

The first control signal generator 241_1 may include a NAND gate which receives the driving enable signal DRV_EN and the data DATA and outputs a low level when the driving enable signal DRV_EN is at a high level and the data DATA is at a high level.

The second control signal generator 241_2 may include a NOR gate which receives the driving enable signal DRV_EN and the data DATA and outputs a high level when the driving enable signal DRV_EN is at a high level and the data DATA is at a low level.

The driving section 243 may include a pull-up transistor MP1 and a pull-down transistor MN1 coupled in parallel to each other between the nodes N1 and N2 in order to control a charge sharing operation, which is performed between the transmission TSV 210 and the dummy TSV 220, in response to a signal outputted from the first control signal generator 241_1 or the second control signal generator 241_2. In other words, when the data DATA is at a high level at the time at which the driving enable signal DRV_EN is at a high level, the pull-up transistor MP1 may be driven when the signal outputted from the first control signal generator 241_1 has a low-level. As the pull-up transistor MP1 is driven to share the voltage level of the second node N2, the voltage level of the first node N1 may increase.

When the data DATA is at a low level at the time at which the driving enable signal DRV_EN is at a high level, the pull-down transistor MN1 may be driven when the signal outputted from the second control signal generator 241_2 has a high-level. As the pull-down transistor MN1 is driven to share the voltage level of the second node N2, the voltage level of the first node N1 may decrease.

Now, the operation of the semiconductor device will be described as follows. Before the driving enable signal DRV_EN is activated, the first level shifter 231 may shift the driving enable signal DRV_EN to the precharge voltage VPD/VPS. The second level shifter 233 may shift the voltage level of the first node N1 to the precharge voltage VPD/VPS, and output the shifted voltage level to the first inverter INV1. The output signal of the first level shifter 231 and the signal inverted through the second inverter INV2 may be used as a signal for controlling the first inverter INV1. The first inverter INV1 may invert the signal outputted from the second level shifter 233 under the control of the signal outputted from the first level shifter 231 and the signal inverted through the second inverter INV2.

In other words, as the transmission TSV 210 is in the initial state, the first node N1 may have a low-level (i.e., a ground voltage VSS), The second level shifter 233 may shift the ground voltage VSS to the voltage level for precharge, and the first inverter INV1 may be driven in response to the signal outputted from the first level shifter 231, and invert the voltage level outputted from the second level shifter 233. Thus, the second node N2 may have a voltage level corresponding to the first precharge voltage VPD having a high level.

At this time, when a write or read command is received from outside, the driving enable signal DRV_EN may be activated and applied to the precharging unit 230 and the driving unit 240. Since the first inverter INV1 is not driven in response to the activated driving enable signal DRV_EN, the operation of the precharging unit 230 may be stopped. Based on the driving enable signal DRV_EN, a signal having a low-level may be outputted from the first control signal generator 241_1 in the driving unit 240 when the data DATA is at a high level. Then, the pull-up transistor MP1, of the driving section 243 may be enabled. As the pull-up transistor MP1 is driven, the first node N1 may share the first precharge voltage VPD corresponding to the voltage of the second node N2, and the potential of the first node N1 may increase to the power supply voltage level VDD. The transmission TSV 210 may drive the voltage level of the first node N1.

On the other hand, when the data DATA is at a low level, the transmission TSV 210 may drive the first node N1 to the ground voltage level VSS corresponding to the initial state, as a high-level signal is outputted from the second control signal generator 241_2 and the pull-down transistor MN1 is driven.

Figure 3:
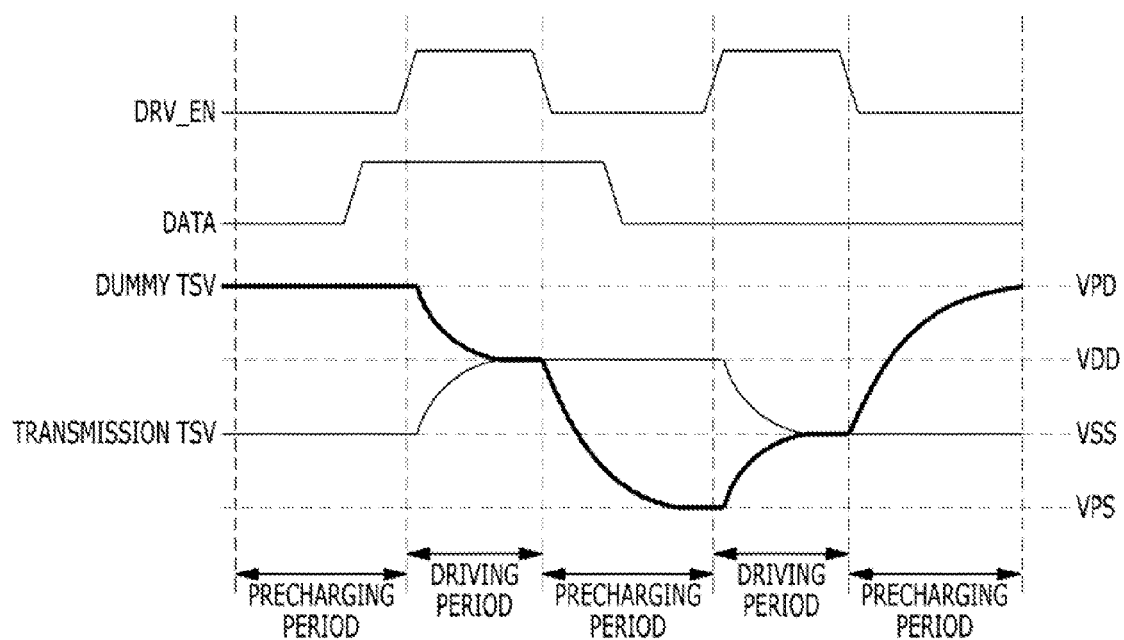
FIG. 3 is a timing diagram for describing an operation of the semiconductor device shown in FIG. 2.

FIG. 3 is a timing diagram for describing an operation of the semiconductor device shown in FIG. 2.

Referring to FIG. 3, the precharging period and the driving period of the semiconductor device may be checked.

First, when the driving enable signal DRV_EN is deactivated, the dummy TSV 220 may shift and invert the voltage level of the transmission TSV 210 having a low level to the voltage level for precharge, and thus have the first precharge voltage VPD at a high level. Then, when the driving enable signal DRV_EN is activated, the precharge operation of the dummy TSV 220 may be stopped, and the charge sharing operation between the transmission TSV 210 and the dummy TSV 220 may be performed. Then, the voltage level of the transmission TSV 210 may increase to the power supply voltage level VDD, based on the data DATA having a high level.

Then, when the driving enable signal DRV_EN is deactivated, the dummy TSV 220 may shift and invert the voltage level of the transmission TSV 210 having a high level to the voltage level for precharge, and thus have the precharge ground voltage VPS at a low level.

Then, when the driving enable signal DRV_EN is activated, the precharge operation of the dummy TSV 220 may be stopped, and a charge sharing operation between the transmission TSV 210 and the dummy TSV 220 may be performed. Then, the voltage level of the transmission TSV 210 may decrease to the ground voltage level VSS, based on the data DATA having a low level.

Then, when the driving enable signal DRV_EN is deactivated, the dummy TSV 220 may be precharged by shifting and inverting the voltage level of the transmission TSV 210 to the voltage level for precharge.

For such an operation, the semiconductor device in accordance with the embodiment of the present invention may be operated as follows.

An operating method of a semiconductor device including the transmission and dummy TSVs which vertically pass through plurality of chips, may include precharging a voltage level of the dummy TSV 220 based on the transmission TSV 210 during a precharge period, charge-sharing the voltage levels of the TSVs based on data during a driving period, and driving the charge-shared voltage level through the transmission TSV 210.

Thus, the semiconductor device in accordance with the first embodiment of the present invention may include the dummy TSV 220, in order to drive data DATA while sharing the charge stored in the dummy TSV 220 during a driving operation for the transmission TSV 210. The semiconductor device may share the charge through the precharged capacitor, and reduce power consumption which may occur during a driving operation in a multi-chip package including a plurality of TSVs.

Figure 4:
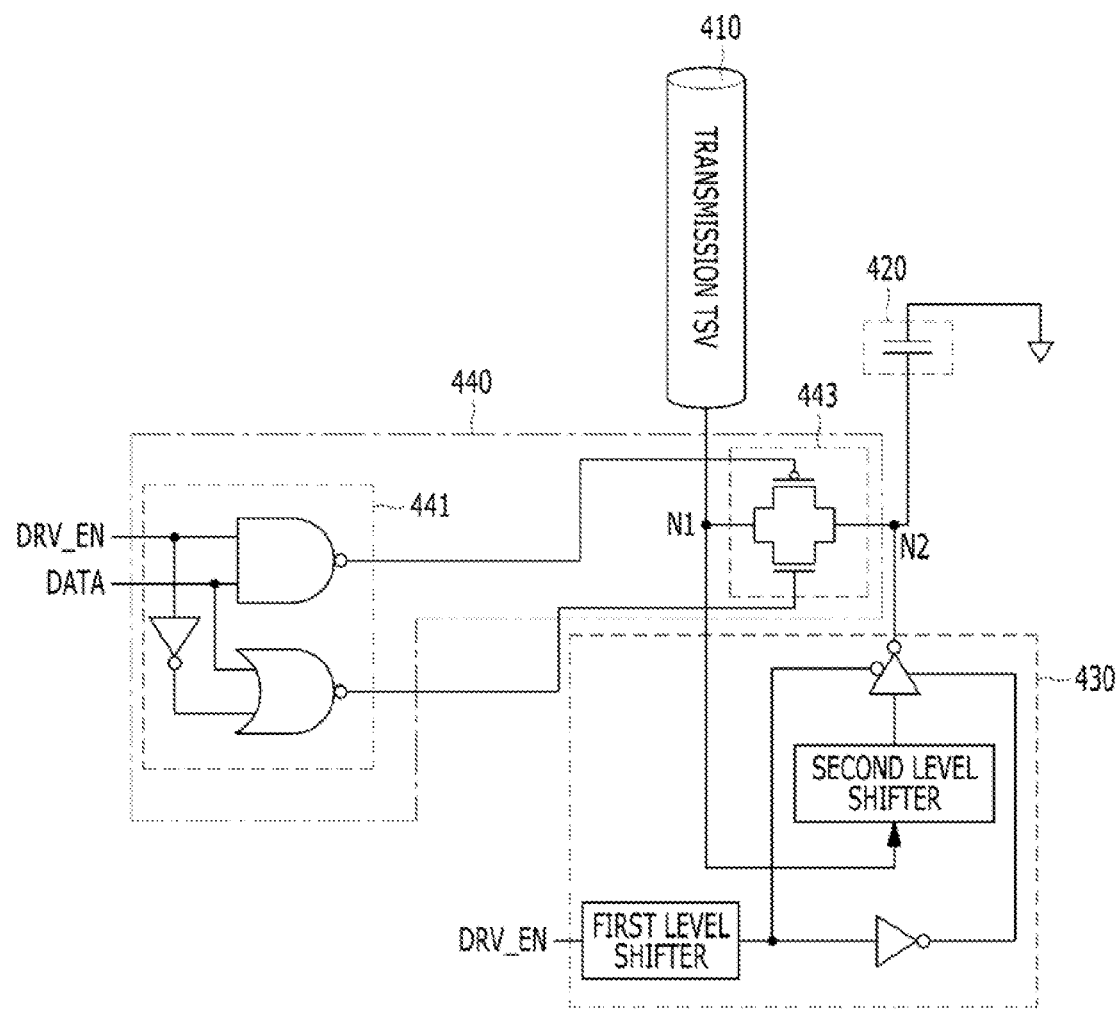
FIG. 4 is a circuit diagram illustrating a power-saving semiconductor device in accordance with an embodiment of the present invention

FIG. 4 is a circuit diagram illustrating a semiconductor device in accordance with an embodiment of the present invention.

Referring to FIG. 4, the semiconductor device may include a transmission TSV 410, a capacitor 420, a precharging unit 430, and a driving unit 440.

The transmission TSV 410 may include a TSV for being driven by data DATA (i.e., the transmission TSV 410 may transmit the data DATA).

The capacitor 420 may be precharged to a precharge voltage VPD/VPS during a precharge period before a driving operation for the transmission TSV 410.

The precharging unit 430 may include the same configuration as the precharging unit 230 shown in FIG. 2. The driving unit 440 may include a control signal generation section 441 and a driving section 443. The control signal generation section 441 and the driving section 443 may have the same configuration as the control signal generation section 241 and the driving section 243 shown in FIG. 2.

That is, as compared with the embodiment of FIG. 2, the dummy TSV 220 is replaced with the capacitor 420 in the embodiment of FIG. 4. Accordingly, descriptions on the configuration and the operation will be omitted.

Although various embodiments have been described for illustrative purposes, it will be apparent to those skilled in the art that various changes and modifications may be made without departing from the spirit and scope of the invention as defined in the following claims.

For example, the positions and types of the logic gates and transistors included in the above-described embodiments may be set in a different manner depending on the polarity of an input signal.

What is claimed is:

1. A semiconductor device comprising:
  a plurality of chips;
  a first through-chip via vertically passing through the chips;
  a power-saving unit suitable for being precharged to a precharge voltage during a precharge period; and
  a driving unit suitable for driving data using the precharged voltage outputted from the power-saving unit, during a driving period.

2. The semiconductor device of claim 1, further comprising a precharging unit suitable for shifting a voltage level of the first through-chip via to the precharge voltage and inverting the precharge voltage, during the precharge period.

3. The semiconductor device of claim 1, wherein the driving unit comprises:
  a control signal generation section suitable for generating a control signal based on the data during the driving period; and
  a driving section suitable for driving the first through-chip via through charge-sharing with the power-saving unit based on the control signal.

4. The semiconductor device of claim 3, wherein the control signal generation section comprises:
  a first control signal generator suitable for generating a control signal having a low level when the data is at a high level during the driving period; and
  a second control signal generator suitable for generating a control signal having a high level when the data is at a low level during the driving period.

5. The semiconductor device of claim 2, wherein the precharging unit comprises:
  a level shifter suitable for shifting a voltage level of the first through-chip via to the precharge voltage; and
  an inverter suitable for inverting a signal outputted from the level shifter and transmitting the inverted signal to the power-saving unit.

6. The semiconductor device of claim 1, wherein the power-saving unit comprises a second through-chip via vertically passing through the chips.

7. The semiconductor device of claim 1, wherein the power-saving unit comprises a capacitor.

8. A semiconductor device comprising:
  a plurality of chips;
  a first through-chip via vertically passing through the chips;
  a power-saving unit suitable for being precharged to a precharge voltage based on a voltage level of the first through-chip via; and
  a driving unit suitable for driving data using the precharged voltage of the power-saving unit based on a driving enable signal.

9. The semiconductor device of claim 8, further comprising a precharging unit suitable for shifting a voltage level of the first through-chip via to the precharge voltage and inverting the precharge voltage, during the precharge period.

10. The semiconductor device of claim 8, wherein the driving unit comprises:
  a control signal generation section suitable for generating a control signal based on the driving enable signal and the data; and
  a driving section suitable for driving the first through-chip via through charge-sharing with the power-saving unit based on the control signal.

11. The semiconductor device of claim 10, wherein the control signal generation section comprises:
  a first control signal generator suitable for generating a control signal having a low level when the data is at a high level and the driving enable signal is activated; and
  a second control signal generator suitable for generating a control signal having a high level when the data is at a low level and the driving enable signal is activated.

12. The semiconductor device of claim 9, wherein the precharging unit comprises:
  a level shifter suitable for shifting a voltage level of the first through-chip via to the precharge voltage; and
  an inverter suitable for inverting a signal outputted from the level shifter and transmitting the inverted signal to the power-saving unit.

13. The semiconductor device of claim 8, wherein the power-saving unit comprises a second through-chip via vertically passing through the chips.

14. The semiconductor device of claim 8, wherein the power-saving unit comprises a capacitor.

15. The semiconductor device of claim 11, wherein the driving section comprises:
   a pull-up transistor suitable for pull-up driving the first through-chip via to a power supply voltage level when the control signal has a low-level; and
   a pull-down transistor suitable for pull-down driving the first through-chip via to a ground voltage level when the control signal has a high-level.

16. An operating method of a semiconductor device including first and second through-chip vias vertically passing through a plurality of chips, comprising:
   precharging the second through-chip via based on a voltage level of the first through-chip via during a precharge period; and
   allowing charge-sharing between the first through-chip via and the second through-chip via based on data to drive the first through-chip via, during a driving period.

17. The operating method of claim 16, wherein the precharging of the second through-chip via comprises:
   shifting a voltage level of the first through-chip via to a precharge voltage level; and
   inverting the shifted voltage level.

* * * * *